(12) United States Patent
Jaaskelainen et al.

(10) Patent No.: US 11,385,107 B2
(45) Date of Patent: Jul. 12, 2022

(54) DISTRIBUTED TEMPERATURE SENSING OVER EXTENDED TEMPERATURE RANGES

(71) Applicant: Halliburton Energy Services, Inc., Houston, TX (US)

(72) Inventors: Mikko Jaaskelainen, Katy, TX (US); Seldon David Benjamin, Spring, TX (US); Henry Timmons Moeller, II, Elgin, TX (US); Jason Edward Therrien, Cypress, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 527 days.

(21) Appl. No.: 16/323,403

(22) PCT Filed: Sep. 29, 2016

(86) PCT No.: PCT/US2016/054393
§ 371 (c)(1),
(2) Date: Feb. 5, 2019

(87) PCT Pub. No.: WO2018/063232
PCT Pub. Date: Apr. 5, 2018

(65) Prior Publication Data
US 2021/0041304 A1 Feb. 11, 2021

(51) Int. Cl.
*G01K 11/32* (2021.01)
*H01S 5/024* (2006.01)
*G01K 11/324* (2021.01)

(52) U.S. Cl.
CPC .......... *G01K 11/32* (2013.01); *H01S 5/02415* (2013.01); *G01K 11/324* (2021.01)

(58) Field of Classification Search
CPC ................. G01K 11/32; G01K 11/324; G01N 2021/4709
See application file for complete search history.

(56) References Cited

U.S. PATENT DOCUMENTS

| 5,113,277 A * | 5/1992 | Ozawa | G01K 11/32 374/E11.015 |
| 6,094,918 A | 8/2000 | Burbidge et al. | |
| 7,504,618 B2 * | 3/2009 | Hartog | G01J 3/4412 250/227.14 |
| 7,881,566 B2 * | 2/2011 | Lees | G01K 11/32 385/12 |

(Continued)

FOREIGN PATENT DOCUMENTS

| CA | 2157679 C * | 4/2001 | .......... G01C 19/721 |
| CN | 109217099 A * | 1/2019 | |

(Continued)

OTHER PUBLICATIONS

PCT Application Serial No. PCT/US2016/054393, International Search Report, dated Jun. 20, 2017, 3 pages.

(Continued)

*Primary Examiner* — Gail Kaplan Verbitsky
(74) *Attorney, Agent, or Firm* — Delizio, Peacock, Lewin & Guerra

(57) ABSTRACT

A method is described for enabling Raman Based Distributed Temperature Sensing (DTS) systems to operate over larger environmental temperature ranges than any systems available today.

20 Claims, 7 Drawing Sheets

(56) References Cited

U.S. PATENT DOCUMENTS

| | | | |
|---|---|---|---|
| 8,496,376 | B2 | 7/2013 | Lee et al. |
| 8,699,009 | B2* | 4/2014 | Li .................... G01M 11/083 356/33 |
| 9,574,949 | B2* | 2/2017 | Belli ................... G01K 11/32 |
| 9,645,018 | B2* | 5/2017 | Lee .................... G01K 15/005 |
| 9,880,035 | B2* | 1/2018 | Zhang ................. G01K 11/32 |
| 10,082,429 | B2* | 9/2018 | Lee .................... G01K 11/32 |
| 2008/0246947 | A1* | 10/2008 | Lees ................... G01K 11/32 374/E11.015 |
| 2013/0121374 | A1* | 5/2013 | Wuest ................. G01K 15/00 374/161 |
| 2013/0215926 | A1 | 8/2013 | Belli et al. |
| 2014/0233600 | A1* | 8/2014 | Lee .................... G01K 11/32 374/1 |
| 2015/0226607 | A1 | 8/2015 | Cooper et al. |
| 2017/0299445 | A1* | 10/2017 | Lee .................... G01K 11/32 |
| 2019/0052063 | A1* | 2/2019 | Tolstikhin ........... H01S 5/02446 |
| 2019/0072417 | A1* | 3/2019 | Khadour ............. G01D 5/35364 |
| 2021/0167566 | A1* | 6/2021 | Su ..................... H01S 3/0602 |

FOREIGN PATENT DOCUMENTS

| | | | |
|---|---|---|---|
| EP | 2806246 | A1 | 11/2014 |
| WO | 2001048471 | A2 | 7/2001 |
| WO | 2004097348 | A1 | 11/2004 |
| WO | 2015187922 | A2 | 12/2015 |
| WO | WO-2018063232 | A1 * | 4/2018 ............ G01K 11/32 |
| WO | WO-2021157411 | A1 * | 8/2021 |

OTHER PUBLICATIONS

PCT Application Serial No. PCT/US2016/054393, International Written Opinion, dated Jun. 20, 2017, 7 pages.

Jaaskelainen, et al., "Dual Laser Scheme Revolutionizes DTS Deployments", 2008 SPE Annual Technical Conference and Exhibition held in Denver, Colorado, USA, Sep. 21-24, 2008, 5 pages.

Mitchell, et al., "Method for Attenuation Calibration of Dual Wavelength and Raman Distributed Temperature Sensing Systems", SPE Heavy Oil Conference held in Calgary, Alberta, Canada, Jun. 11-13, 2013, 3 pages.

* cited by examiner

DISTRIBUTED TEMPERATURE SENSING OVER EXTENDED TEMPERATURE RANGES

BACKGROUND

The discovery reported below is the enablement of Raman based Distributed Temperature Sensing (DTS) systems that can operate over a larger environmental temperature range than the systems available today.

A single wavelength Raman based Distributed Temperature Sensing (DTS) system sends out a short laser pulse and measures back scattered Stokes and anti-Stokes light. The transmitted pulse as well as the back-scattered light passes through a number of optical components with different wavelength dependent attenuations as well as through the optical fiber where they experience wavelength dependent optical attenuation. This wavelength dependent optical attenuation causes differential attenuation between the Stokes and anti-Stokes intensities. The laser center wavelength is tuned using a thermo-electric cooler (TEC) to match the optical filters that are used to filter out the Stokes and anti-Stokes, i.e. each DTS system is tuned to a specific wavelength to get a known differential attenuation, and the remnant differential attenuation can then be compensated using e.g. a correction factor that is proportional to the travel distance along the optical fiber. If anything affects the measured Stokes and anti-Stokes intensities, e.g. optical fiber attenuation change over wavelength and/or distance, laser wavelength shift or optical component attenuation that is different between the Stokes and anti-Stokes optical path, then this will result in a false report of the measured temperature, i.e. measurement error. Each single wavelength DTS system is carefully tuned and calibrated around the set-point of the laser. The environmental range where a DTS system can maintain its calibration is highly dependent on the temperature range where the thermo-electric cooler (TEC) can maintain temperature lock (and thus laser wavelength lock), typically up to +/−30 C or even up to +/−40 C. The same challenge holds true for another important opto-electronic component in laser systems, i.e. the photo diode (Avalanche Photo Diode or APD) where the temperature is also TEC controlled.

A dual laser DTS requires careful tuning of each laser within the filter window as well as careful tuning of the wavelength separation between the two lasers. A properly tuned dual laser system will not have measurement error due to changes in intensity between the Stokes and anti-Stokes components. In dual laser systems, we have to properly tune a system such that the effective Rayleigh attenuation of the laser at the Stokes wavelength is equivalent to the attenuation experienced by the Anti-Stokes of the Raman backscattered light, and vice-versa.

Certain combinations of dual lasers have proven to be very effective in a number of applications in providing effective self-calibration or auto correction methodology. Some proven commercial systems include a primary wavelength of 975 (nm) coupled with a correcting light source of 940 (nm). Another is a primary wavelength of 1500 (nm) coupled with a correcting light source of 1410 (nm). And a third would be a commercially available measurement light source of primary wavelength of 1030 (nm) coupled with a correcting light source of 990 (nm).

The methodology disclosed herein can be used in a number of these dual laser DTS systems. For illustrative purposes the third example given here—a commercially available measurement light source of primary wavelength of 1030 (nm) coupled with a correcting light source of 990 (nm) will be used as an illustrative example throughout.

In another embodiment presented herein the application of this approach to single laser systems will be illustrated and a single laser of wavelength 990 nm will be used to illustrate.

Due to the thermal sensitivity in the available lasers Thermoelectric coolers (TEC) are often employed to maintain the laser setpoint. Unfortunately, TECs, however useful, have several challenges that are relevant to this problem:

1) There is a maximum temperature delta that any TEC can maintain. TECs remove heat from one side of the TEC to another side of the TEC, and this heat must then be removed. This is in particular challenging in hot environments where there is a challenge to remove the heat from the hot side of the TEC. Failure to remove this heat may result in thermal run-away of the TEC and catastrophic failure of the laser.
2) TECs require a fair amount of power to hold their temperature setpoint, and this power consumption increases exponentially as the temperature difference between the environment and the setpoint increases. I.e. the efficiency of TEC's decrease as the environmental temperature move further away from the setpoint, and this cause a number of challenges.

The problem occurs when experiencing large temperature deltas. For practical reasons, regions that experience large temperature deltas, i.e. >40 C in a short time period, are often extremely remote and have severely tight restrictions when it comes to power draw. Most places are not connected to the power grid and systems must be run off of batteries, which can be recharged by a number of means, e.g. mechanical, replacement, or solar. All power options turn out to be prohibitive in either cost, size or system/data reliability. Options to heat or cool enclosures where the DTS is housed exist but they drive power consumption and overall system size, which in the end drives cost.

For large temperature deltas, the power requirements of the TEC will eclipse the power draw of every other component in the DTS system by a factor of two easily. Eventually once, the TEC maximum delta has been reached within the DTS system, the TEC temperature setpoint will drift. Once drifting begins, measurement errors are introduced. Functionally what this means is that data becomes unreliable and may vary with environmental temperature. For long term production monitoring, where we are concerned with 0.5 K temperature deltas, this degradation in calibration accuracy will quickly become an issue.

In remote locations, stand-alone systems are required, and the system cost is directly related to the power consumption. E.g. large solar powered systems require larger batteries and larger enclosures, and by forcing a TEC to run at its maximum, the power consumption will increase, and the system must be sized for the worst-case conditions.

There is then a need for a new approach, one that maintains system accuracy over the full extended temperature range expected while maintaining lower power requirements.

DETAILED DESCRIPTION

In the following detailed description, reference is made to accompanying drawings that illustrate embodiments of the present disclosure. These embodiments are described in sufficient detail to enable a person of ordinary skill in the art to practice the disclosure without undue experimentation. It should be understood, however, that the embodiments and examples described herein are given by way of illustration only, and not by way of limitation. Various substitutions, modifications, additions, and rearrangements may be made without departing from the spirit of the present disclosure. Therefore, the description that follows is not to be taken in a limited sense, and the scope of the present disclosure will be defined only by the final claims.

The traditional way to tune a DTS system is to define a setpoint and tune the system to work +/−30 C or maybe +/−40 C around this setpoint. This result in the challenges described earlier. Systems are now required that can function from −40 C (northern locations) to as high as 70 C (desert locations). This range far exceeds capability of TEC's employed.

Disclosed herein is a solution set where the setpoints can be dynamically changed based on the environmental temperature to minimize the power consumption of the laser TEC's while expanding the environmental temperature operating range of the DTS systems.

For the dual laser system, the autocorrection that occurs depends on the wavelengths of the transmitted laser pulses, the back-scattered Stokes and anti-Stokes components and how they are located within the optical bandwidth of the receiving optics. The receiving optics may have temperature dependent attenuation that may vary with environmental temperature. An optimized operating setpoint can then be identified for any given sub-temperature range within the full environmental temperature range. A number of pre-defined operating setpoints with appropriate overlap can then be calibrated and a system may change set-point based on the environmental temperature. A DTS system is no longer dependent on the maximum swing of the laser TEC as traditionally used.

This means that a system calibration now becomes a dynamic calibration where the lasers are tuned while minimizing the power consumption of the TECs controlling the opto-electronic components such as lasers and APDs. Since semiconductor lasers have very well known wavelength dependence as a function of temperature (nominally 0.3 nm/C), the temperature setpoint of the lasers can be made in response to the ambient temperature of the DTS unit. In so doing, both the power draw of the unit and the induced temperature measurement error can be minimized.

Figure 1:
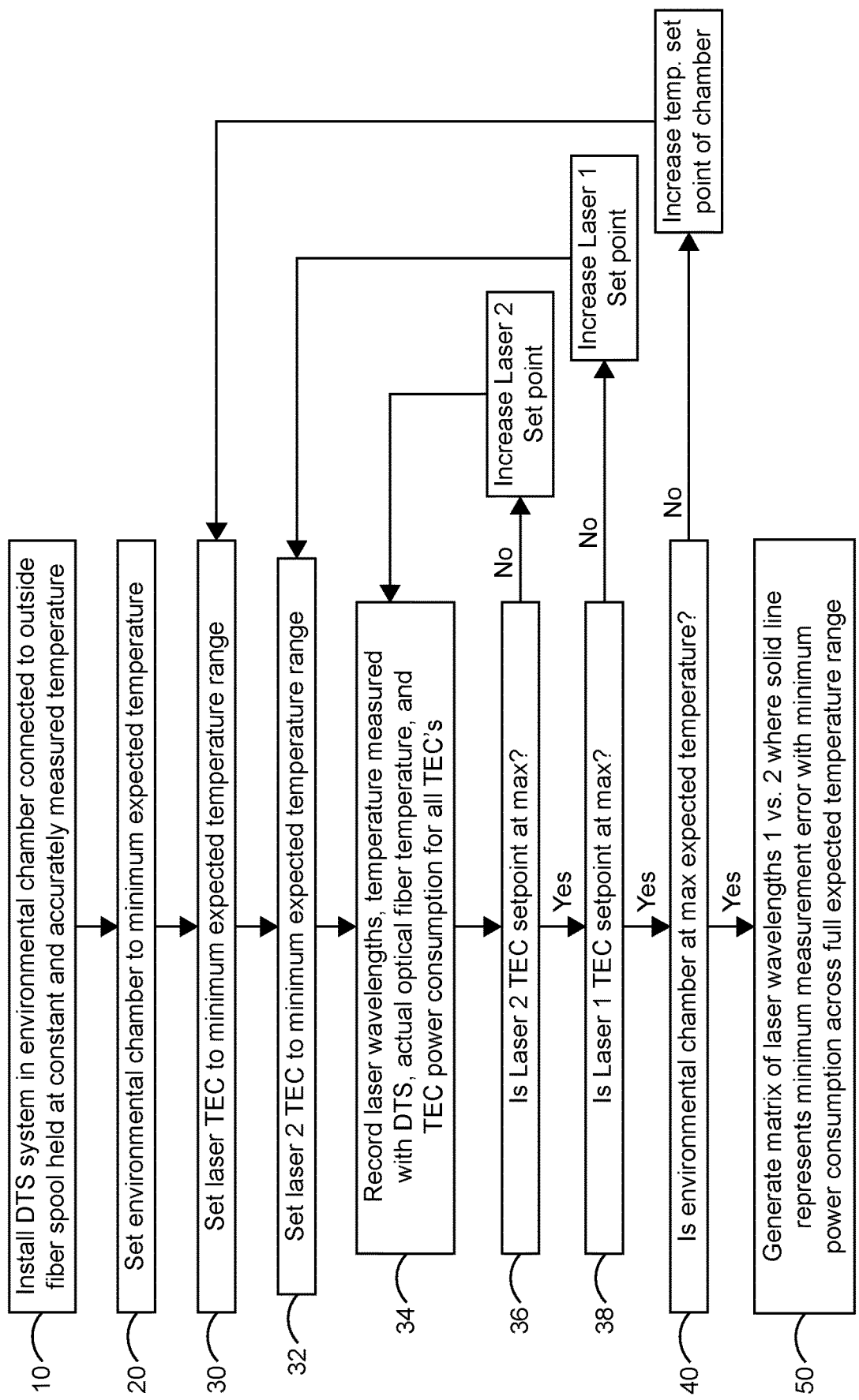
FIG. 1 is a flow chart of the method for generating the map of FIG. 2.
Figure 2:
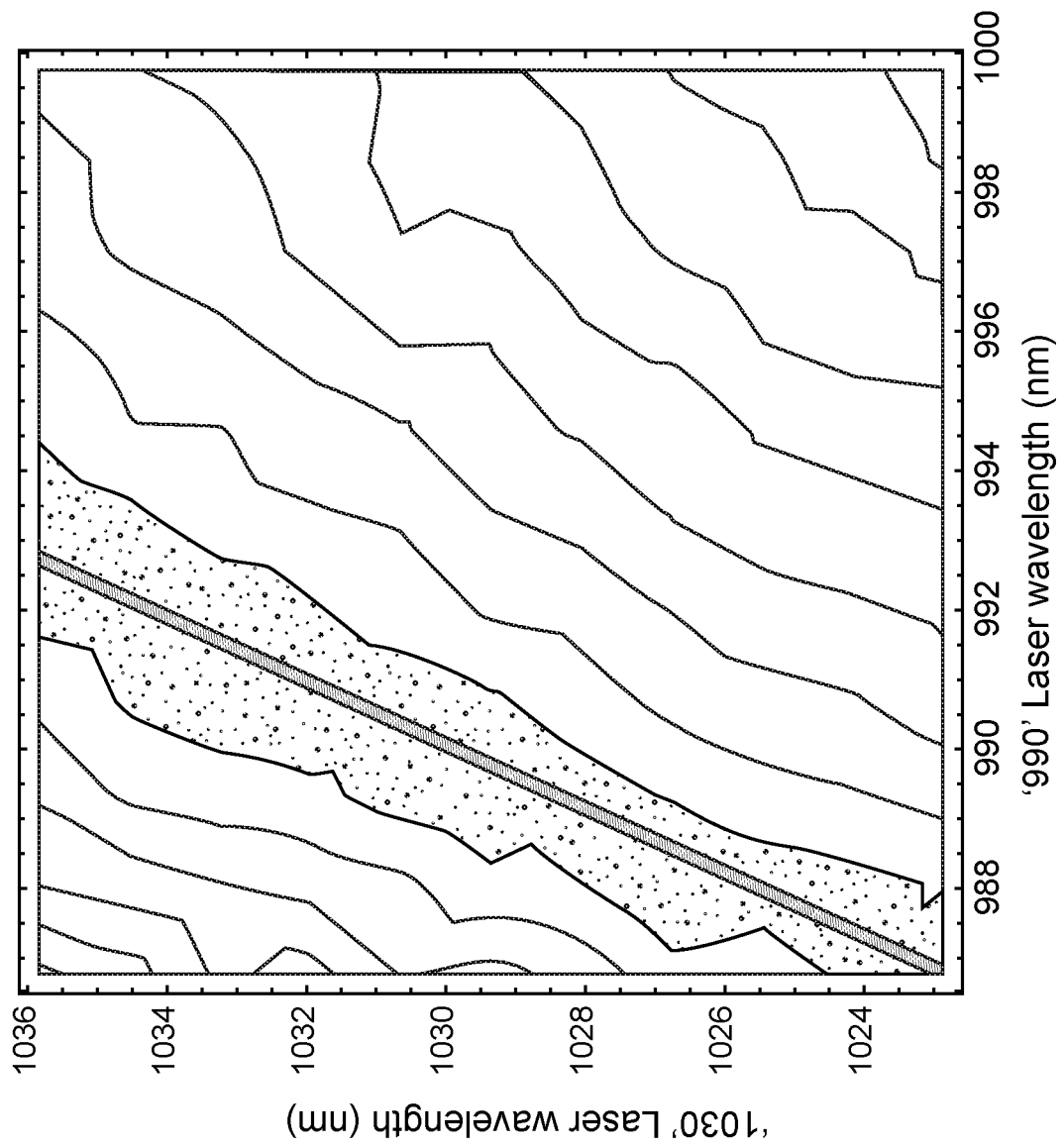
FIG. 2 illustrates a temperature measurement error map for a dual laser DTS system as a function of incident wavelengths. It is generated using the method of FIG. 1.

The method to be described can be understood by simultaneously viewing FIGS. 1 and 2. FIG. 2 illustrates a map where bands of induced measurement error vs. laser tuning wavelength for a dual laser system has been identified. FIG. 1 is a flowchart of how FIG. 2 is generated.

In a dual laser DTS system, this is how the differential attenuation in FIG. 2 manifests. The goal then, is to pick a wavelength for the '990 nm' laser that falls on the straight line, then use the complimentary '1030 nm' wavelength. For example, picking 988 nm for the '990 nm' laser would require thermally setting the '1030 nm' laser to 1026 nm.

This map can be systematically produced scanning over the setpoint range of the thermoelectric controllers. When you take a trace of this fiber (described below), the amount of error induced by differential attenuation will result in distance dependent temperature error which can be quantified as a slope, $\Delta$(degrees C.)/$\Delta$(distance in km).

The steps for taking such a trace are detailed in FIG. 1 as follows:

First, in step 10 a DTS system is installed in an environmental chamber and connected to outside fiber spool held at constant measured temperature. The fiber spool can be made up of one or more optical fibers with varying optical properties ranging from new pristine fibers to heavily Hydrogen darkened fibers. In a second step 20 we set the environmental chamber to the minimum of the full extended environmental temperature range expected. The first laser TEC is then set 30 at the minimum of the full extended temperature range expected. The second laser is then set 32 at the minimum of the full extended temperature range expected. Then 34, 36 the second laser setpoints are stepped through a series of pre-determined increases until the second laser TEC maximum setpoint is reached. As this is done all of the laser wavelengths, temperatures measured with DTS, actual optical fiber temperatures, and TEC power consumptions are recorded.

The first laser TEC setpoint is then increased by a predetermined amount and the process 32,34,36 for the second laser is repeated. As this process continues all laser wavelengths, DTS measured temperatures, actual optical fiber temperatures and TEC power consumptions are recorded 34.

Once the two lasers TEC's have been stepped through the expected temperature range the environmental chamber's temperature is increased and the entire sequence 30,32,34, 36,38 is repeated 40 until the full matrix is completed.

This process generates 50 the matrix of laser wavelengths of the first and second lasers of FIG. 2. The solid line in that plot represents the minimum measurement error with minimum power consumption across the full extended environmental temperature range expected.

An optimized solution map will also include temperature induced component attenuation that may impact accuracy settings for other opto-electric components such as the photo detector(s).

Figure 3:
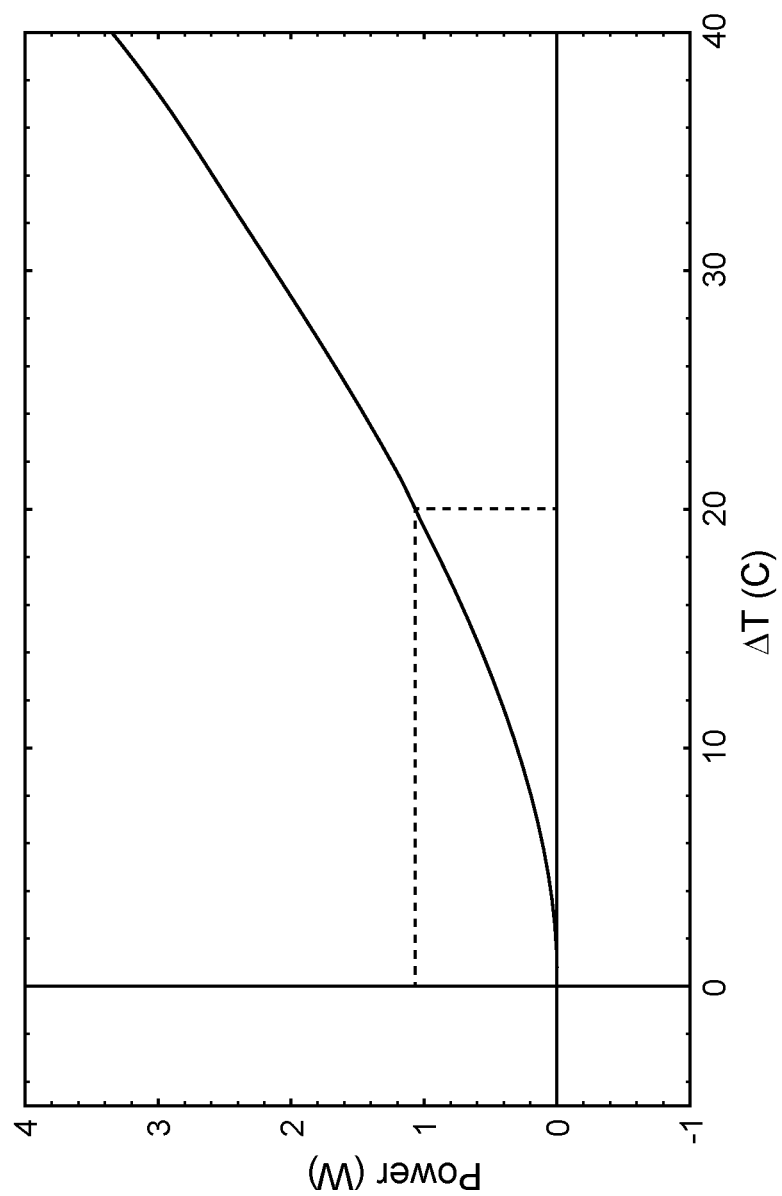
FIG. 3 illustrates the power draw of a TEC as a function of temperature delta held.

In addition to accuracy, we have to keep in mind power draw. As can be seen in FIG. 3, by doubling the temperature delta held, we quadruple the amount of power required to hold a setpoint. With this constraint we can identify a region of the parameter space that satisfies both requirements of low power draw and minimizing the impact on data quality.

From FIG. 2 the straight line corresponds to wavelength pairs needed for a correctly tuned DTS. FIG. 2 demonstrates that there are several complimentary wavelength pairs that provide a properly tuned DTS. With FIG. 3 in mind, for an ambient temperature of 40 C, we would set the 990 nm laser to 988 nm, and the 1030 nm laser to 1026 nm. If the ambient temperature were to increase to 55 C though, we would then tune the 990 nm laser to 992 nm and the 1030 nm laser to 1032 nm to minimize the power draw of the system while making sure that the temperature traces are accurate. This new setpoint would be good for an ambient up to 75 C without impacting power draw.

Figure 4:
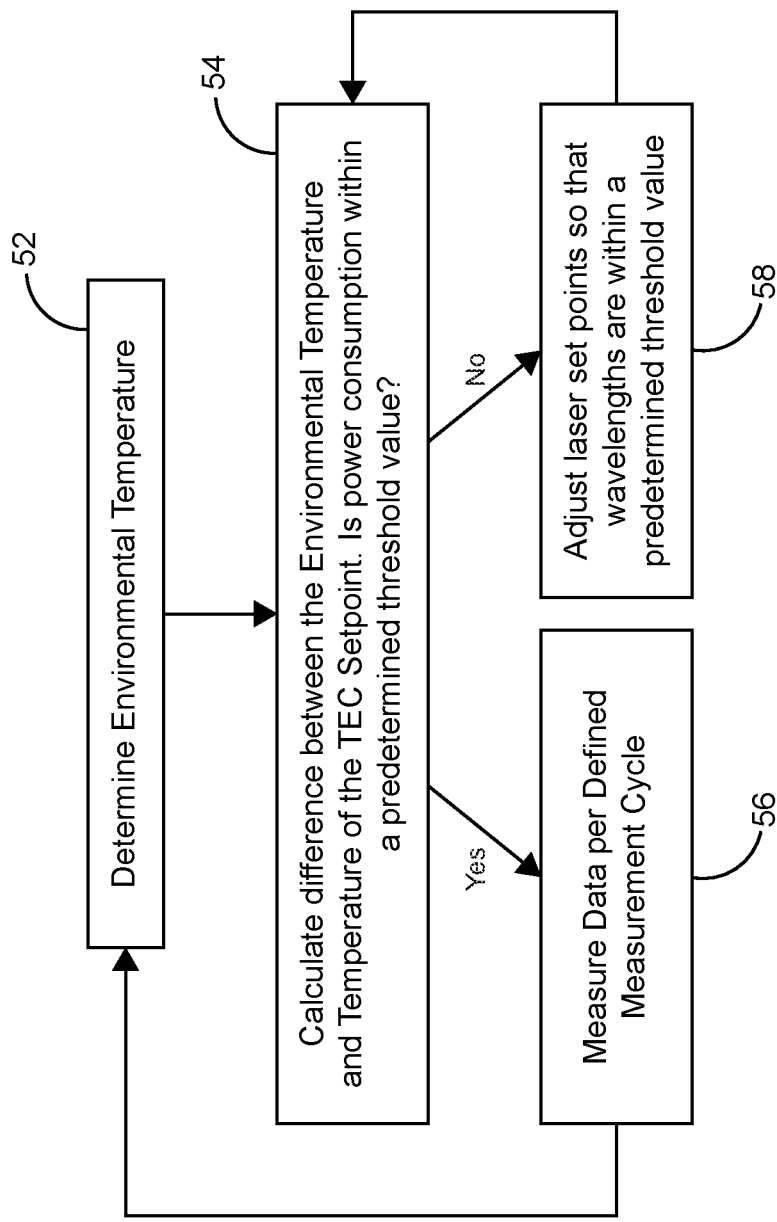
FIG. 4 illustrates a decision flow chart for determining which wavelengths to use in dual laser systems.

FIG. 4 illustrates the decision tree for determining the wavelengths to use in a dual laser system. When the difference between the Environmental Temperature and the Temperature of the laser TEC setpoints is too large compared to a predetermined threshold value of acceptable wavelengths, resulting in excess power consumption, the laser setpoints are adjusted based on the dark line created from FIGS. 1 and 2. This is repeated until the power consumption is in an acceptable range.

Single Laser Systems

Note that in DTS systems both temperature and wavelength dependent attenuation can affect performance. In dual laser systems with auto correction the design of the dual laser system and the wavelengths of the two lasers chosen can effectively deal with the attenuation issue. For a single laser system however, we must make adjustments to account for attenuation. So for single laser systems we can generate a different map to use where the differential attenuation factor (DAF) is known as a function of incident wavelengths. As the incident wavelength changes, so does the differential attenuation factor. The response of the detector may also vary with temperature, and may be tuned in sync with the laser setpoint. This can then be used to properly correct the data set for any changes due to changing DTS thermal operating setpoint for the opto-electric devices within the system.

Figure 5:
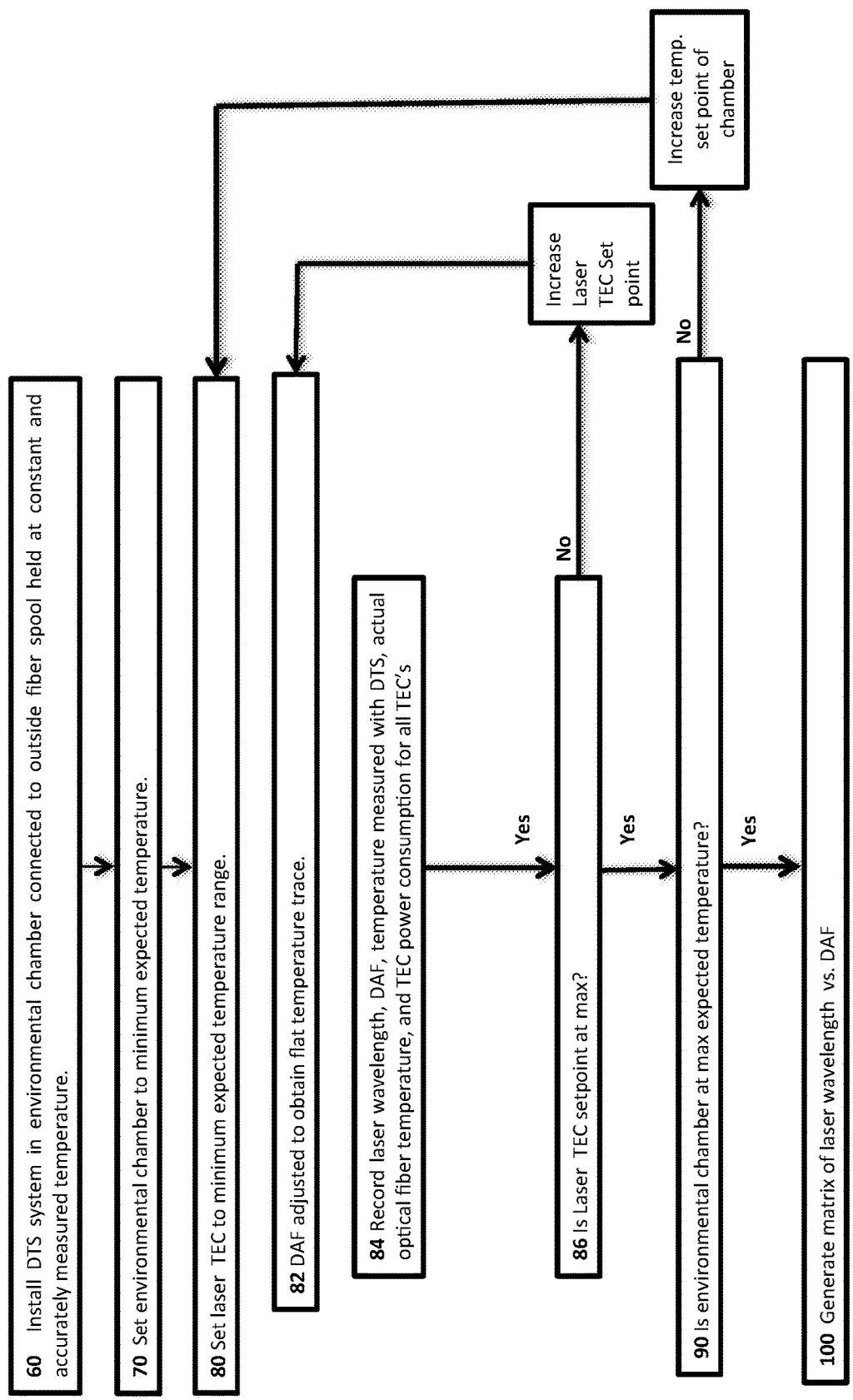
FIG. 5 is a flow chart of the method for generating the map of FIG. 6.

The methodology for dealing with single laser DTS systems and applying DAF is illustrated in FIG. 5, in a process similar to that of FIG. 1 for dual laser systems.

First, in step 60 a DTS system is installed in an environmental chamber and connected to outside fiber spool held at constant measured temperature. As before the fiber spool can be made up of one or more optical fibers with varying optical properties ranging from new pristine fibers to heavily Hydrogen darkened fibers. In a second step 70 the environmental chamber is set to the minimum of the full expected temperature range. The single laser TEC is then set 80 at the minimum of the full extended temperature range expected. Then 82 the DAF is adjusted to obtain a flat temperature profile. Then 84 the laser wavelength, DAF, temperature measured with DTS, actual optical fiber temperature, and TEC power consumption of the laser TEC are recorded.

The single laser TEC setpoint is then increased by a predetermined amount and the process 82, 84, 86 is repeated, recording the laser wavelength, DAF, temperature measured with DTS, actual optical fiber temperature, and TEC power consumption of the laser TEC.

Once the single laser TEC's have been stepped through the full extended environmental temperature range expected the environmental chamber's temperature is increased by a pre-determined amount and the entire sequence 80, 82, 84, 86 is repeated until the full extended environmental temperature range expected is completed.

Figure 6:
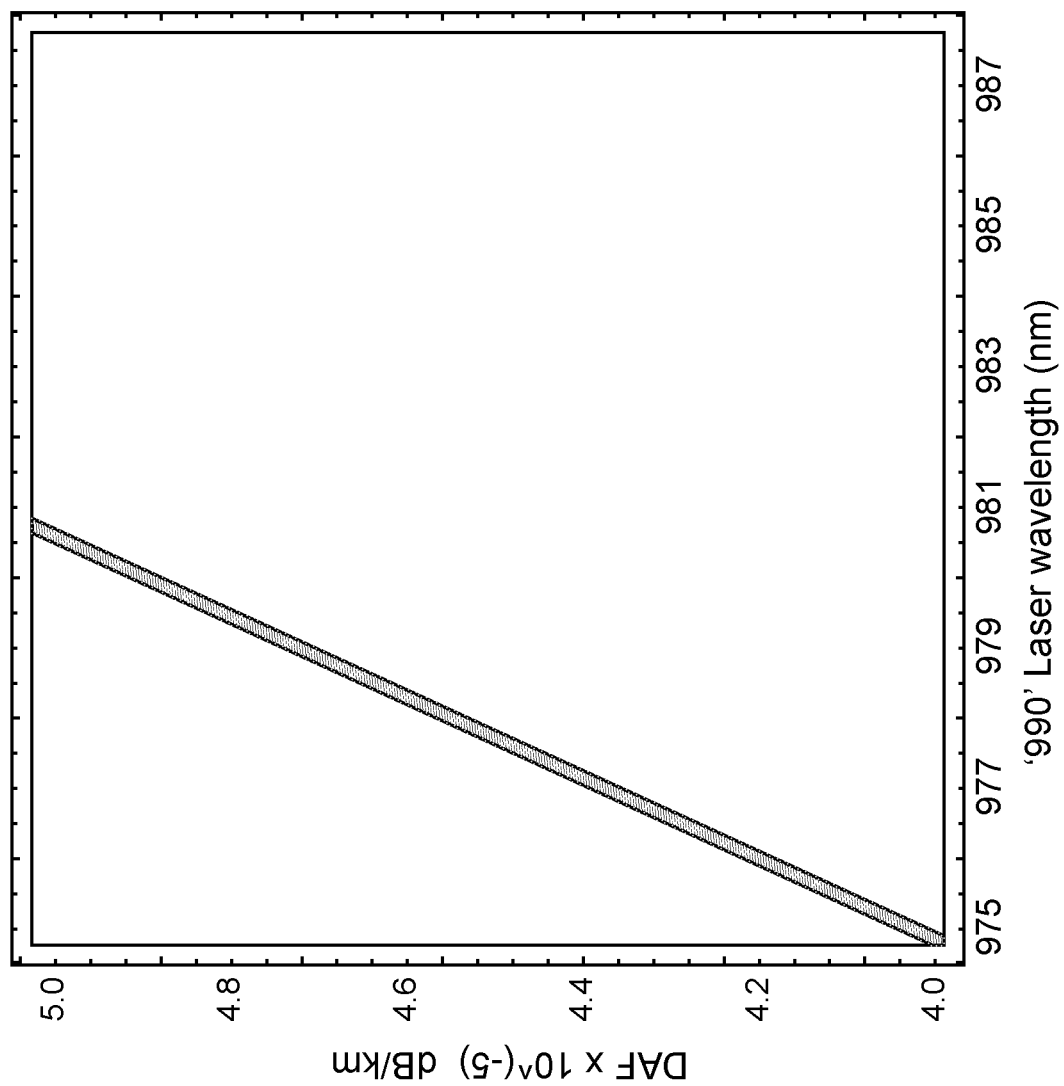
FIG. 6 illustrates a temperature measurement error map as a function of incident wavelengths. It is generated using the method of FIG. 1.

This process generates 100 a matrix of laser wavelengths of the single laser illustrated in FIG. 6. The solid line in that plot represents the minimum measurement error with minimum power consumption across the full extended environmental temperature range expected.

Using the information of the recommended wavelength illustrated in FIG. 6, when the difference between the Environmental Temperature and the Temperature of the laser TEC setpoints is too large, resulting in excess power consumption, the laser setpoint is adjusted based on the dark line created of FIG. 6. This is repeated until the power consumption is in an acceptable range.

Incorporating APD TEC's Into the Methodology

In another embodiment Avalanche Photo Diodes (APD's) with their associated TEC's are being used increasingly in long-range fiber optic applications and represent another power draw in these systems. The methodology described herein could also be used to include the APD TEC's in the methodology for more power savings over extended temperature ranges. Referring to FIG. 1 this can be done by adding an additional step between steps 32 and 34 to set any APD TEC's setpoints to the minimum expected temperature, then add an additional loop within the 34,36 loop which stepwise increases the APD TEC setpoints over the full environmental temperature range expected, recording all of the data in step 34 and in addition recording the APD TEC power consumptions. The process would still generate a final matrix of laser wavelengths that represent minimum measurement errors with minimum power consumption.

Stand-Alone Solar Power Systems Over Extended Environmental Ranges

The methodology described herein is of great value in remote installations of DTS systems. Some example systems include cold climate areas in which oil and gas exploration is being done often require permanent monitoring solutions utilizing fiber optics and associated electronics and these have several challenges from a logistics and/or environmental perspective. The available daylight may be low and the location normally doesn't have infrastructure so power must be supplied through batteries and solar panels. Temperature may dip very low in the winter posing challenges for electronics and optics in terms of operating temperature. Heating the electronics is costly as the power system with batteries and solar panels grows and may not be practical. It is therefore desirable to have a more efficient system that minimizes the solar panels, batteries and environmental footprint, including mechanical, environmental and visual.

The methodology described herein is illustrated by way of graphical representation as in FIGS. 2 and 6 but the matrix of recorded laser wavelengths, DAF, DTS temperature measurements, actual fiber temperatures, and various TEC power consumptions can be reduced to hardware or software algorithms or look-up tables that are programmed to automatically minimize the power draw based on the environmental temperature in the field. Use of this methodology thus reduces the power draw and capital investment of batteries and solar panels needed over multiple systems in large fields. These multiple installations can also be supplied with control units transmitting control signals to the DTS systems and communications units that receive commands from the control units and transmit the resultant data to data gathering stations.

Figure 7:
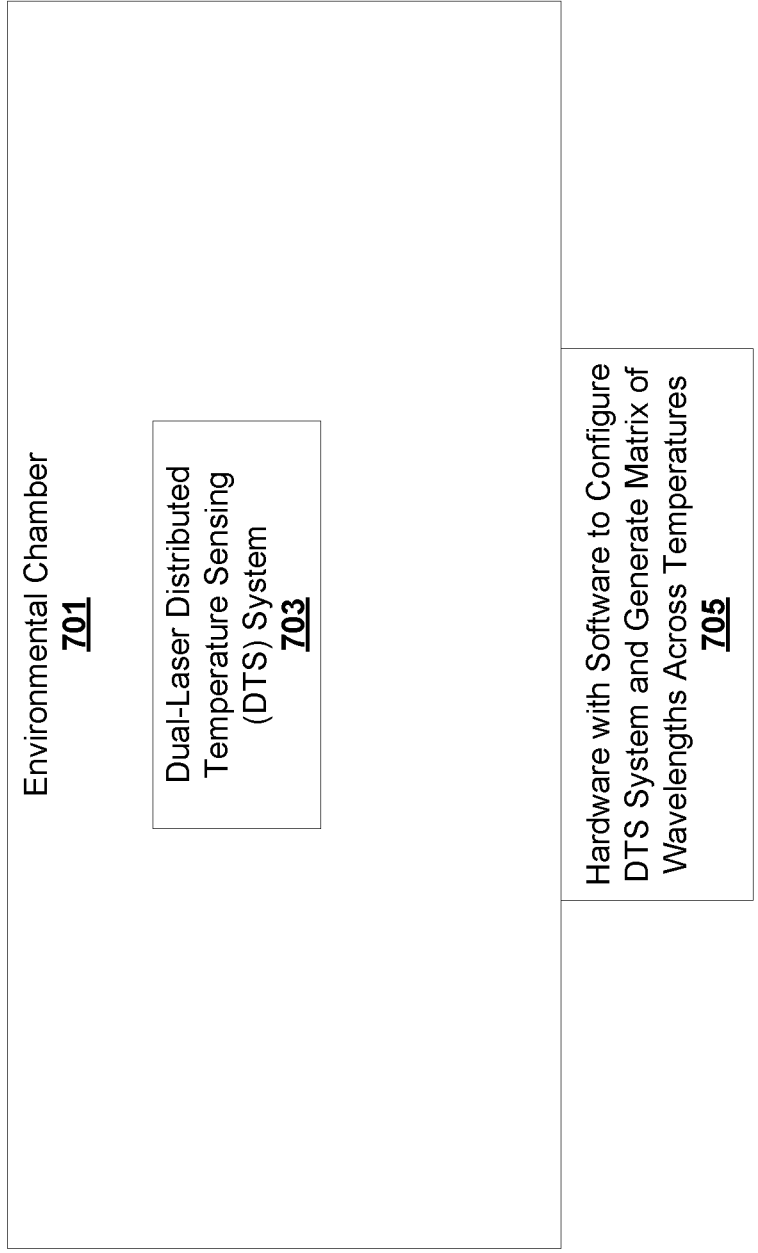
FIG. 7 is a diagram of a dual laser DTS system installed in an environmental chamber.

FIG. 7 is a diagram of a dual laser DTS system installed in an environmental chamber. An environmental chamber 701 is depicted with a dual laser DTS system 703 installed therein. As is known, the dual laser DTS system 703 includes fiber optic cable, lasers, and TECs associated with the lasers. Hardware 705 includes software to configure the DTS system 703 and generate a matrix of operational parameters as described previously.

Value Added

Earlier attempts include costly AC cooled enclosures and large solar panels whereas the proposed solution reduces the power footprint and associated cost while extending the environmental operating range. There is great need for extremely low power and accurate DTS systems. Without properly calibrated systems data becomes unreliable, or power draw becomes too much to sustain in remote locations, or becomes cost prohibitive. The proposed solution makes it more possible to manufacture one set of DTS hardware for different applications and thereby reduce manufacturing cost and simplicity.

Although certain embodiments and their advantages have been described herein in detail, it should be understood that various changes, substitutions and alterations could be made without departing from the coverage as defined by the appended claims. Moreover, the potential applications of the disclosed techniques is not intended to be limited to the particular embodiments of the processes, machines, manufactures, means, methods and steps described herein. As a person of ordinary skill in the art will readily appreciate from this disclosure, other processes, machines, manufactures, means, methods, or steps, presently existing or later to be developed that perform substantially the same function or achieve substantially the same result as the corresponding embodiments described herein may be utilized. Accordingly, the appended claims are intended to include within their scope such processes, machines, manufactures, means, methods or steps.

The invention claimed is:

1. A method comprising:
   installing a distributed temperature sensing (DTS) system in an environmental chamber, wherein the installing comprises,
   positioning a fiber optic cable in the environmental chamber; and
   coupling, with the fiber optic cable, a first laser with a first thermo-electric cooler and a second laser with a second thermo-electric cooler; and
   generating, by the DTS system, a matrix of operational parameters, wherein generating the matrix comprises,
   for each of a plurality of ambient temperature settings in the environmental chamber,
   determining, by the DTS system, an operating set point of the first thermo-electric cooler for each temperature value of a range of temperature values of the first thermo-electric cooler;
   at each operating set point of the first thermo-electric cooler, determining, by the DTS system, an operating set point of the second thermo-electric cooler for each temperature value of a range of temperature values of the second thermo-electric cooler; and
   updating, by the DTS system, the matrix to indicate a laser wavelength of each of the first and second lasers and a power consumption of each of the first and second thermo-electric coolers at each operating set point of the first and second thermo-electric coolers.

2. The method of claim 1, wherein determining, by the DTS system, the operating set point of the first thermo-electric cooler for each temperature value of the range of temperature values of the first thermo-electric cooler and determining, by the DTS system, the operating set point of the second thermo-electric cooler for each temperature value of the range of temperature values of the second thermo-electric cooler comprises:
   setting, by the DTS system, a first operating set point of the first thermo-electric cooler to a minimum of the range of temperature values of the first thermo-electric cooler;
   setting, by the DTS system, a second operating set point of the second thermo-electric cooler to a minimum of the range of temperature values of the second thermo-electric cooler;
   determining, by the DTS system, the operating set point of the first thermo-electric cooler for each temperature value of the range of temperature values of the first thermo-electric cooler; and
   for each operating set point of the first thermo-electric cooler, determining the operating set point of the second thermo-electric cooler for each temperature value of the range of temperature values of the second thermo-electric cooler.

3. The method of claim 1, further comprising:
   determining whether an amount of power consumed by each of the first and second thermo-electric coolers exceeds a power consumption threshold;
   in response to determining that the amount of power consumed by each of the first and second thermo-electric coolers has exceeded the power consumption threshold, determining an actual laser wavelength for the first laser and the second laser; and
   adjusting the actual operating set point to reduce the amount of power consumed by each of the first and second thermo-electric coolers while maintaining the actual laser wavelength of each of the first and second lasers within a wavelength threshold.

4. The method of claim 1 further comprising adjusting the environmental chamber to each of the plurality of ambient temperature settings.

5. The method of claim 1, further comprising indicating correlated wavelength pairs of the first laser and the second laser in the matrix.

6. The method of claim 5, wherein the correlated wavelength pairs represent minimum measurement errors of the lasers across the plurality of ambient temperature settings with minimum power consumption of the thermo-electric coolers.

7. The method of claim 1 further comprising holding the fiber optic cable at a constant temperature.

8. The method of claim 3, wherein determining whether an amount of power consumed by each of the first and second thermo-electric coolers has exceeded a power consumption threshold comprises determining whether a difference between ambient temperature and temperature of at least one of the first and second thermo-electric cooler setpoints exceeds a predetermined threshold value.

9. A system comprising:
   a distributed temperature sensing (DTS) system to be positioned in an environmental chamber, the DTS system coupled to,
   a first laser proximate to a first thermo-electric cooler;
   the first thermo-electric cooler;
   a second laser proximate to a second thermo-electric cooler; and
   the second thermo-electric cooler;
   a fiber optic cable further coupled to the first laser and the second laser;
   a processor; and
   a machine-readable medium having instructions stored thereon that are executable by the processor to cause the system to,
   generate a matrix of operational parameters for the DTS system for each of a plurality of ambient temperatures in the environmental chamber, wherein the instructions that are executable by the processor to cause the processor to generate the matrix comprise instructions that are executable by the processor to cause the processor to, step an operating set point of the first thermo-electric cooler across a range of temperatures of the first thermo-electric cooler;

at each operating set point of the first thermo-electric cooler, step an operating set point of the second thermo-electric cooler across a range of temperatures of the second thermo-electric cooler from a minimum temperature of the second thermo-electric cooler; and update the matrix to indicate a laser wavelength of each of the first and second lasers and a power consumption of each of the first and second thermo-electric coolers at each step.

10. The system of claim 9, wherein the instructions that are executable by the processor to cause the processor to step the operating set point of the first thermo-electric cooler and the second thermo-electric cooler across the range of temperatures of the first and second thermo-electric coolers comprise instructions that are executable by the processor to cause the processor to:

set a first operating set point of the first thermo-electric cooler to a minimum of the range of temperatures of the first thermo-electric cooler;

set a second operating set point of the second thermo-electric cooler to a minimum of the range of temperatures of the second thermo-electric cooler;

step the first thermo-electric cooler across the range of temperatures of the first thermo-electric cooler; and for each step of the first thermo-electric cooler, step the second thermo-electric cooler across the range of temperatures of the second thermo-electric cooler.

11. The system of claim 9, wherein the instructions comprise instructions that are executable by the processor to cause the system to:

determine whether an amount of power consumed by each of the first and second thermo-electric coolers exceeds a power consumption threshold;

in response to determining that the amount of power consumed by each of the first and second thermo-electric coolers has exceeded the power consumption threshold, determine an actual laser wavelength for the first laser and the second laser; and adjust the actual operating set point to reduce the amount of power consumed by each of the first and second thermo-electric coolers while maintaining the actual laser wavelength of each of the first and second lasers within a wavelength threshold.

12. The system of claim 9, further comprising adjusting the environmental chamber to each of the plurality of ambient temperature settings.

13. The system of claim 9, wherein the DTS system is a Raman-based distributed temperature sensing system.

14. The system of claim 9, wherein the fiber optic cable comprises one or more optical fibers of varying optical properties ranging from new pristine fibers to heavily Hydrogen darkened fibers.

15. The system of claim 9, wherein the instructions that are executable by the processor to cause the processor to generate the matrix of operational parameters for the DTS system further comprise instructions to indicate correlated wavelength pairs of the first laser and the second laser in the matrix.

16. The system of claim 15, wherein the correlated wavelength pairs represent minimum measurement errors of the lasers across the plurality of ambient temperature settings with minimum power consumption of the thermo-electric coolers.

17. The system of claim 11, wherein the machine-readable medium further having stored thereon instructions executable by the processor to cause the system to determine whether a predetermined threshold value of acceptable laser wavelengths of the first and second lasers has been exceeded.

18. The system of claim 11, wherein the instructions to adjust the actual operating set point to reduce the amount of power consumed by each of the first and second thermo-electric coolers while maintaining the actual laser wavelength of each of the first and second lasers within a wavelength threshold comprise instructions executable by the processor to cause the system to maintain a temperature lock of the thermo-electric coolers when the actual operating set point has been reached.

19. A machine-readable medium comprising instructions to:

generate a matrix of operational parameters for a distributed temperature sensing (DTS) system, wherein the instructions to generate the matrix comprise instructions to, for each of a plurality of ambient temperature settings in an environmental chamber in which the DTS system has been installed, step an operating set point of a first thermo-electric cooler across a range of temperatures of the first thermo-electric cooler, wherein the first thermo-electric cooler is associated with a first laser of the DTS system;

at each operating set point of the first thermo-electric cooler, step an operating set point of a second thermo-electric cooler across a range of temperatures of the second thermo-electric cooler, wherein the second thermo-electric cooler is associated with a second laser of the DTS system; and update the matrix to indicate a laser wavelength of each of the first and second lasers and a power consumption of each of the first and second thermo-electric coolers at each step.

20. The machine-readable medium of claim 19 further comprising instructions to:

determine whether an amount of power consumed by each of the first and second thermo-electric coolers exceeds a power consumption threshold;

in response to a determination that the amount of power consumed by each of the first and second thermo-electric coolers has exceeded the power consumption threshold, determine an actual laser wavelength for the first laser and the second laser; and adjust the actual operating set point to reduce the amount of power consumed by each of the first and second thermo-electric coolers while maintaining the actual laser wavelength of each of the first and second lasers within a wavelength threshold.

* * * * *